United States Patent
Dai et al.

(10) Patent No.: US 11,382,250 B2
(45) Date of Patent: **\*Jul. 5, 2022**

(54) POSITIONING DEVICE

(71) Applicants: Tyco Electronics (Shanghai) Co. Ltd., Shanghai (CN); Shenzhen AMI Technology Co., Ltd., Shenzhen (CN); TE Connectivity Corporation, Berwyn, PA (US); Measurement Specialties (China) Ltd., Shenzhen (CN)

(72) Inventors: Zhiyong Dai, Shanghai (CN); Dandan Zhang, Shanghai (CN); Roberto Francisco-Yi Lu, Bellevue, WA (US); Songping Chen, Shenzhen (CN); Xiangyou Hou, Shenzhen (CN); Qinglong Zeng, Shenzhen (CN); Lvhai Hu, Shanghai (CN); Yun Liu, Shanghai (CN); Changjun Wang, Shanghai (CN)

(73) Assignees: Tyco Electronics (Shanghai) Co., Ltd., Shanghai (CN); TE Connectivity Corporation, Berwyn, PA (US); Shenzhen AMI Technology Co., Ltd, Shenzhen (CN); Measurement Specialties (China) Ltd., Shenzhen (CN)

( * ) Notice: Subject to any disclaimer, the term of this patent is extended or adjusted under 35 U.S.C. 154(b) by 925 days.

This patent is subject to a terminal disclaimer.

(21) Appl. No.: 16/169,241

(22) Filed: Oct. 24, 2018

(65) Prior Publication Data

US 2019/0124804 A1 Apr. 25, 2019

(30) Foreign Application Priority Data

Oct. 24, 2017 (CN) .......................... 201711001666.9

(51) Int. Cl.
  *H05K 13/04* (2006.01)
  *H05K 13/00* (2006.01)
  *H05K 1/18* (2006.01)

(52) U.S. Cl.
  CPC ......... *H05K 13/0452* (2013.01); *H05K 1/183* (2013.01); *H05K 13/0015* (2013.01); *H05K 13/0069* (2013.01)

(58) Field of Classification Search
  CPC ........... H05K 13/0452; H05K 13/0015; H05K 13/0069; H05K 1/183; H05K 1/184; H05K 3/0008; H05K 2203/167
  See application file for complete search history.

(56) References Cited

U.S. PATENT DOCUMENTS 4,586,247 A * 5/1986 Murai ................ H05K 13/0417
  29/705
5,994,648 A * 11/1999 Glovatsky .............. H05K 1/119
  174/260

(Continued)

*Primary Examiner* — Joseph J Hail
*Assistant Examiner* — J Stephen Taylor
(74) *Attorney, Agent, or Firm* — Barley Snyder

(57) ABSTRACT

A positioning device that has a support table, two pairs of sliding blocks slidably mounted in the support table, a positioning plate extending vertically at the top of each sliding block, a base on which the support table is supported, a cylinder in the base, a ball in the cylinder, a piston rod slidably mounted in the cylinder and pushing the ball to move upward in a vertical direction, so that the ball drives the two pairs of sliding blocks to move away from each other in the first horizontal direction and the second horizontal direction, respectively, until the positioning plates of the two pairs of sliding blocks abut against four inner walls of the opening of the circuit board, respectively, to allow the electronic device to be received in a positioning slot defined by the positioning plates, and a release mechanism that drives the piston rod to move downward in the vertical (Continued)

direction to allow the two pairs of sliding blocks to be moved toward each other in the first horizontal direction and the second horizontal direction, so that the positioning plates drive the electronic device in the positioning slot to move toward a center of the opening.

20 Claims, 3 Drawing Sheets

(56) References Cited

U.S. PATENT DOCUMENTS

| | | | | |
|---|---|---|---|---|
| 6,266,873 | B1* | 7/2001 | Kitamura | H05K 13/041 |
| | | | | 29/832 |
| 6,415,493 | B1* | 7/2002 | Pawlenko | H05K 7/1454 |
| | | | | 269/903 |
| 6,971,157 | B1* | 12/2005 | Yoshida | H05K 13/0452 |
| | | | | 29/739 |
| 10,368,447 | B2* | 7/2019 | Yamamuro | B25J 15/04 |
| 10,999,961 | B2* | 5/2021 | Dai | H05K 13/0015 |

\* cited by examiner

//POSITIONING DEVICE

CROSS-REFERENCE TO RELATED APPLICATION

This application claims the benefit of the filing date under 35 U.S.C. § 119(a)-(d) of Chinese Patent Application No. 201711001666.9 filed on Oct. 24, 2017.

FIELD OF THE INVENTION

The present invention relates to a positioning device and, more particularly, to a positioning device adapted to centrally position an electronic device in an opening of a circuit board.

BACKGROUND

In the related art, it is sometimes necessary to solder an electronic device on a circuit board in a sinking manner, that is, a main body of the electronic device is at least received in an opening of the circuit board and soldering legs of the electronic device are supported on a surface of the circuit board and soldered to electrical contacts of the circuit board.

In order to improve the soldering quality of the electronic device, the main body of the electronic device should be centrally positioned in the opening of the circuit board. To ensure that the main body of the electronic device may be centrally positioned in the opening in the circuit board, the size of the opening of the circuit board should be formed to precisely match the size of the main body of the electronic device. However, such a solution is not feasible in practical applications because there is manufacturing error in the size of the main body of the electronic device and if the size of the main body of the electronic device is slightly larger than the size of the opening of the circuit board, it may result in the impossibility of the main body of the electronic device being accommodated in the opening of the circuit board and precise control of the size of the main body of the electronic device and the size of the opening of the circuit board may result in a sharp increase in manufacturing cost.

In order to reduce the manufacturing cost, in the related art, the size of the opening of the circuit board is generally formed to be much larger than the size of the main body of the electronic device, so that the main body of the electronic device may always be accommodated in the opening of the circuit board. However, this in turn leads to another problem in that it is not easy to centrally position the main body of the electronic device in the opening of the circuit board, which reduces the positioning accuracy and the soldering quality of the electronic device.

SUMMARY

In accordance with the present invention, a positioning device for positioning an electronic device in an opening of a circuit board includes a support table on which the circuit board is supported and two pairs of sliding blocks slidably mounted in the support table and movable in a first horizontal direction and a second horizontal direction perpendicular to the first horizontal direction, with a positioning plate extending vertically on the top of each sliding block. A positioning device constructed in accordance with present invention also has a base on which the support table is supported, a cylinder in the base, a ball in the cylinder a piston rod slidably mounted in the cylinder. The piston rod pushes the ball upward in a vertical direction with the ball driving the two pairs of sliding blocks to move away from each other in the first horizontal direction and the second horizontal direction, respectively, until the positioning plates of the two pairs of sliding blocks abut against four inner walls of the opening of the circuit board, respectively, to allow the electronic device to be received in a positioning slot defined by the positioning plates. A positioning device constructed in accordance with present invention also has a release mechanism that drives a lower end of the piston rod to move downward in the vertical direction to allow the two pairs of sliding blocks to be moved toward each other in the first horizontal direction and the second horizontal direction, so that the positioning plates drive the electronic device received in the positioning slot to move toward a center of the opening of the circuit board.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF THE EMBODIMENT(S)

Figure 1:
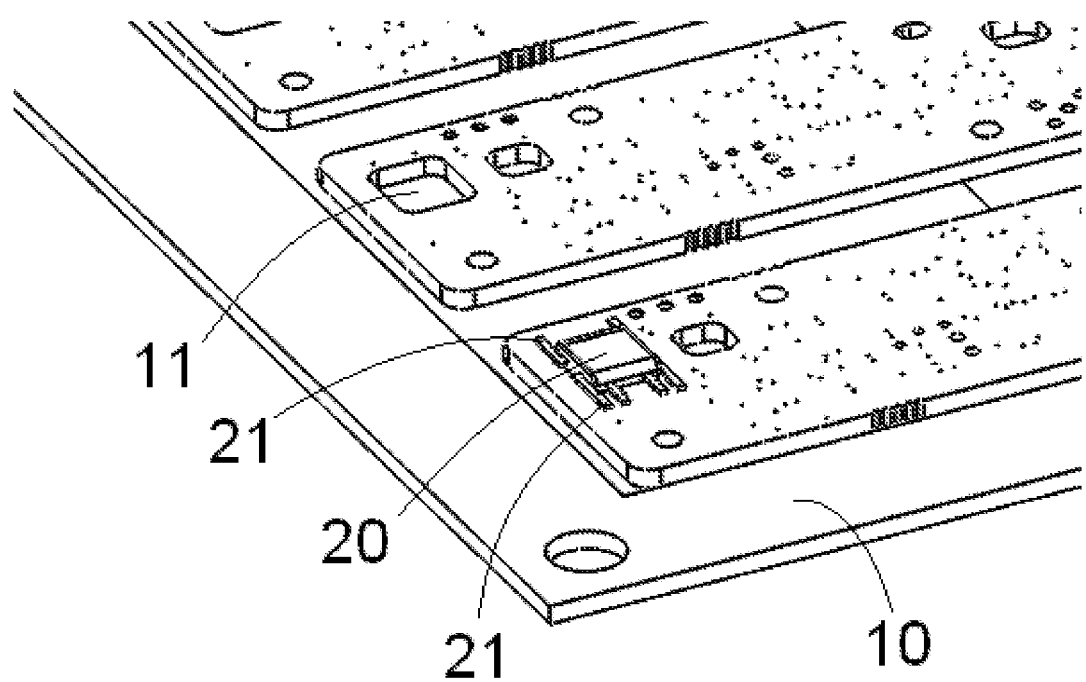
FIG. 1 shows a schematic view of a circuit board and an electronic device soldered on the circuit board according to an exemplary embodiment of the present invention.

Exemplary embodiments of the present invention will be described hereinafter in detail with reference to the drawings, wherein the like reference numerals refer to the like elements. It should be understood that the description to the embodiments of the present invention in conjunction with the drawings is to convey a general concept of the present invention to the person of ordinary skill in the art, than to limit the present invention to the described exemplary embodiments.

Furthermore, in the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
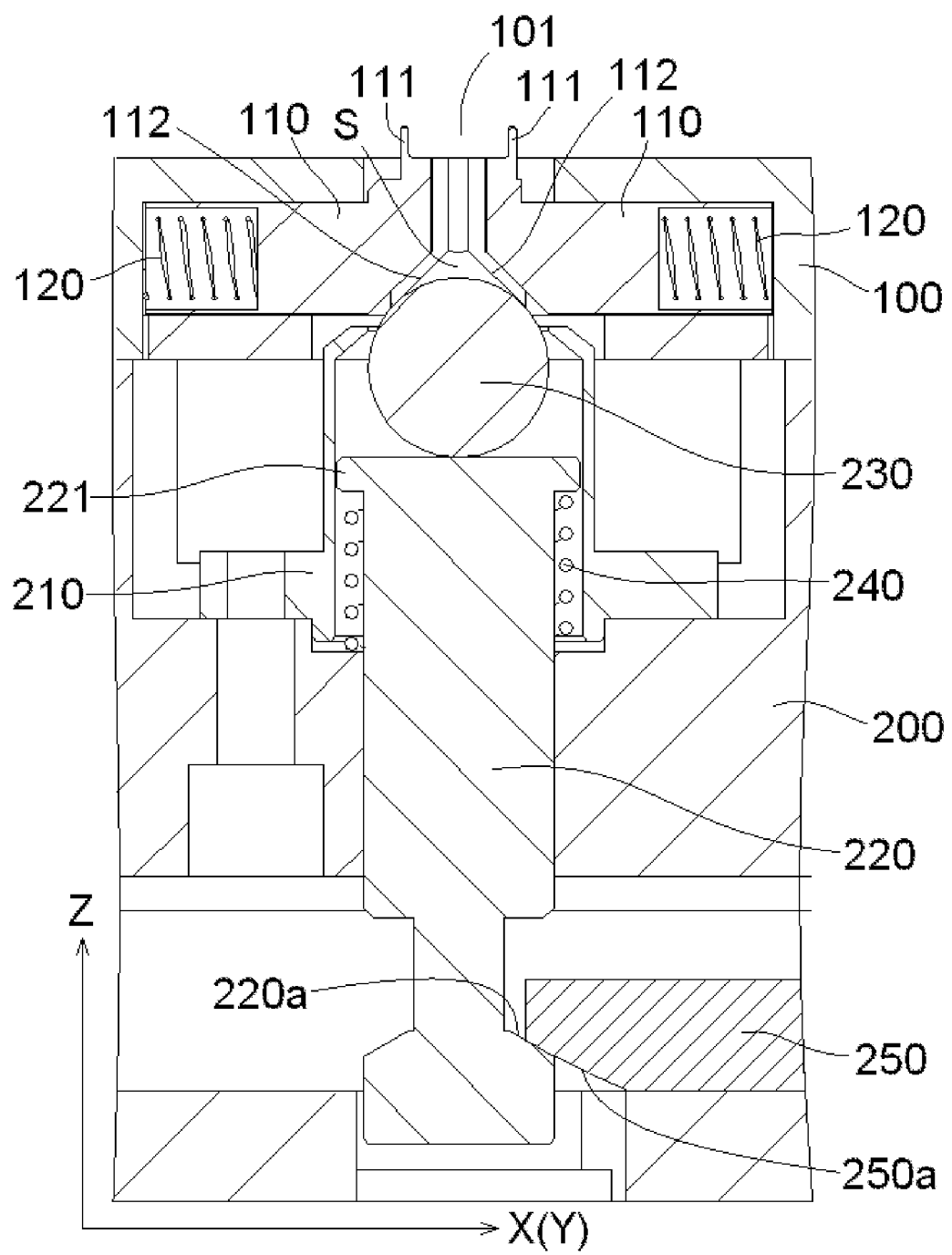
FIG. 2 shows a sectional view of a positioning device for centrally positioning an electronic device in an opening of a circuit board according to an exemplary embodiment of the present invention, wherein the circuit board, the electronic device and a pressing device are not shown.
Figure 3:
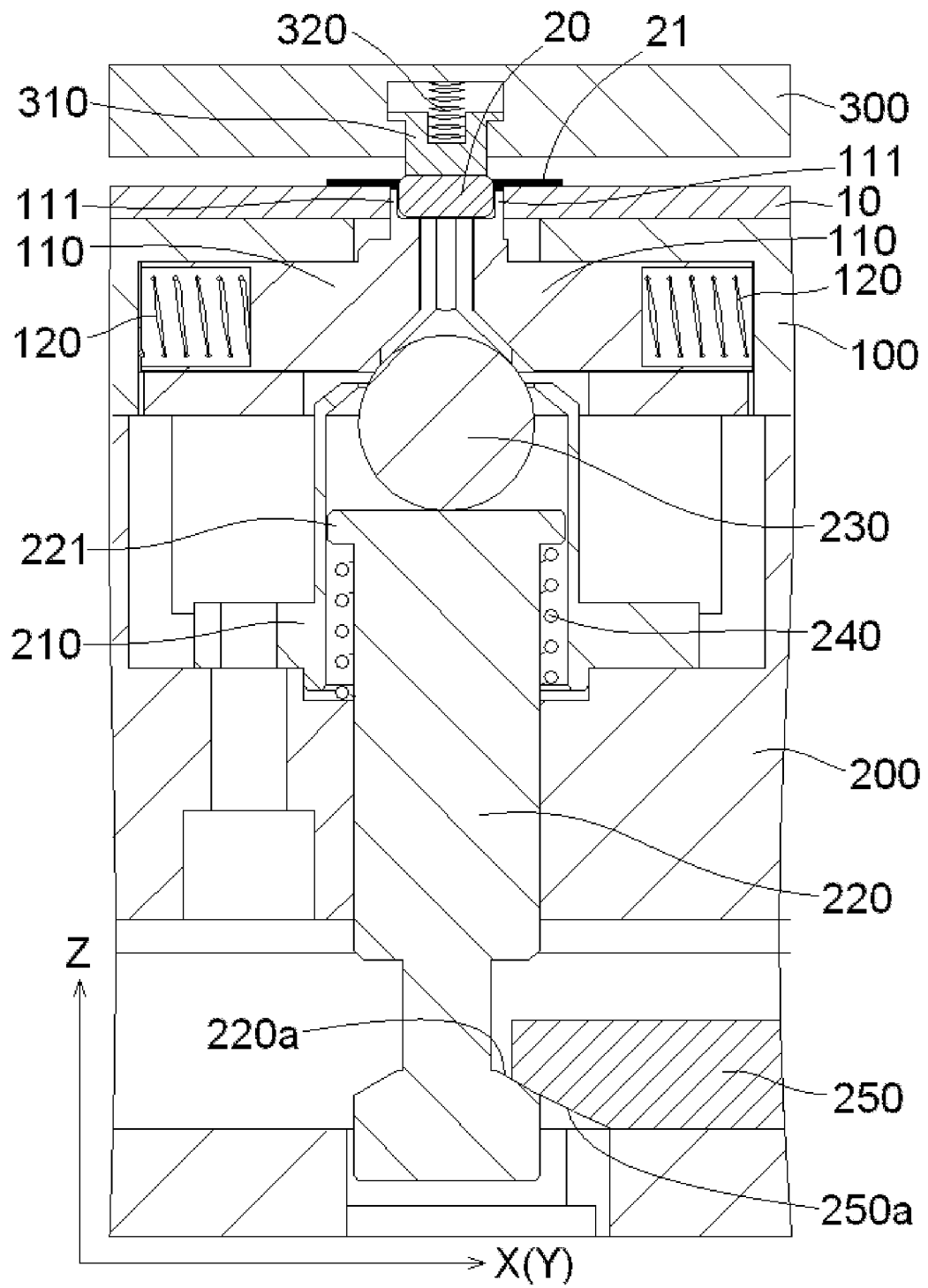
FIG. 3 shows a sectional view of the positioning device for centrally positioning an electronic device in the opening of the circuit board according to an exemplary embodiment of the present invention, wherein the circuit board, the electronic device and a pressing device are shown.

As shown in FIGS. 1, 2, and 3, in an exemplary embodiment of the present invention, the positioning device is capable of centrally positioning an electronic device 20 in an opening 11 of a circuit board 10, reducing the positioning error of the electronic device 20 in the opening 11 of the circuit board 10. The positioning device mainly includes a support table 100, two pairs of sliding blocks 110, a base 200, a cylinder 210, a piston rod 220, a ball 230, and a release mechanism. The circuit board 10 is supported on the support table 100. The two pairs of sliding blocks 110 are slidably mounted in the support table 100 and are movable in a first horizontal direction X and a second horizontal direction Y perpendicular to the first horizontal direction X. One pair of sliding blocks 110 of two pairs of sliding blocks 110 are opposite to each other and movable with respect to each other in the first horizontal direction X and the other pair of two pairs of sliding blocks 110 are opposite to each other and movable with respect to each other in the second horizontal direction Y.

As shown in FIGS. 1, 2, and 3, in an exemplary embodiment of the present invention, the support table 100 is supported on the base 200. The cylinder 210 is installed in a chamber of the base 200. The piston rod 220 is slidably mounted in the cylinder 210 and is movable up and down in a vertical direction Z. The ball 230 is received in the cylinder 210 and is capable of being moved upward to a work position (the position as shown by FIGS. 2 and 3), where the ball 230 is brought into contact with the sliding blocks 110, in the vertical direction Z, under the push of the piston rod 220.

As shown in FIGS. 1, 2, and 3, in an exemplary embodiment of the present invention, a positioning plate 111 extending vertically is on a top of each sliding block 110. The four positioning plates 111 of two pairs of sliding blocks 110 may project from the surface of the support table 100, and may be inserted into the opening 11 of the circuit board 10. When the ball 230 is moved toward the work position in the vertical direction Z under the push of the piston rod 220, the ball 230 pushes the two pairs of sliding blocks 110 to move far away from each other in the first horizontal direction X and the second horizontal direction Y, respectively, until the positioning plates 111 of the two pairs of sliding blocks 110 abut against four inner walls of the opening 11 of the circuit board 10, respectively. As shown in FIGS. 2 and 3, in this case, a positioning slot defined by the positioning plates 111 is large enough to easily receive the electronic device 20. Therefore, the electronic device 20 is adapted to be received and positioned in a positioning slot 101 defined by the positioning plates 111.

As shown in FIGS. 1, 2, and 3, in an exemplary embodiment of the present invention, the release mechanism is adapted to drive a lower end of the piston rod 220 to move downward to a release position where the ball 230 is separated from the sliding blocks 110, in the vertical direction to allow the two pairs of sliding blocks 110 to be moved toward each other in the first horizontal direction and the second horizontal direction, such that the positioning plates drive the electronic device received in the positioning slot to move toward a center of the opening. Thereby, the electronic device may be centrally positioned in the opening of the circuit board, reducing the positioning error of the electronic device, increasing the positioning precision of the electronic device, and improving the welding quality of the electronic device.

As shown in FIGS. 1, 2, and 3, in an exemplary embodiment of the present invention, a slope surface 112 at the bottom of each sliding block 110 and a horn-shaped space S is defined or surrounded by the slope surfaces 112 of two pairs of sliding blocks 110 and gradually expands from the top portion thereof to the bottom portion thereof. A top portion of the ball 230 is received in the horn-shaped space S and may abut against the slope surfaces 112 of the two pairs of sliding blocks 110 at the same time when in the work position, so that the ball 230 may smoothly push the two pairs of sliding blocks 110 to move far away from each other in the first horizontal direction X and the second horizontal direction Y, respectively.

As shown in FIGS. 1, 2, and 3, in an exemplary embodiment of the present invention, the positioning device further includes four restoring springs 120 in the support table 100 and the four restoring spring 120 push against the sliding blocks 110, respectively. The ball 230 drives against elastic forces of the four restoring springs 120, the two pairs of sliding blocks 110 to move far away from each other in the first horizontal direction and the second horizontal direction. When the ball 230 is moved downward from the work position toward the release position in the vertical direction Z, the two pairs of sliding blocks 110 are moved toward each other in the first horizontal direction X and the second horizontal direction Y under the push of the restoring springs 120, such that the positioning plates 111 are moved from inner walls of the opening 11 of the circuit board 10, respectively, and drive the electronic device 20 received in a positioning slot 101 to move toward the center of the opening 11 until a balance is achieved between elastic forces applied on each pair of sliding blocks 110 by the restoring springs 120. In this way, the electronic device may be centrally positioned in the opening of the circuit board.

As shown in FIGS. 1, 2, and 3, in an exemplary embodiment of the present invention, the positioning device further includes a pushing spring 240, which is in the cylinder 210 and biases the piston rod 220 upward in the vertical direction Z so as to drive the piston rod 220 to move upward in the vertical direction Z and thus push the ball 230 to the work position through the piston rod 220. In this way, the ball 230 may push the two pairs of sliding blocks 110 to move far away from each other in the first horizontal direction X and the second horizontal direction Y, respectively, against the four restoring springs 120. It is appreciated that an elastic force applied on the ball 230 by the pushing spring 240 is greater than that applied by the four restoring springs 120, so that the pushing spring 240 may push the ball 230 to move upward against the four restoring springs 120.

As shown in FIGS. 1, 2, and 3, in an exemplary embodiment of the present invention, a top of the piston rod 220 has a flange 221 and the pushing spring 240 is sleeved on the piston rod 220 and abuts against a bottom surface of the flange 221.

As shown in FIGS. 1, 2, and 3, in an exemplary embodiment of the present invention, the release mechanism includes: a first slope surface 220*a* on the lower end of the piston rod which extends out of the cylinder and a release slider 250, which is slidably mounted in the base 200 and is moveable in a horizontal direction perpendicular to the vertical direction Z and a second slope surface 1250*a* which is mated with the first slope surface 220*a,* being formed on the release slider 250.

As shown in FIGS. 1, 2, and 3, in an exemplary embodiment of the present invention, when the release slider 250 is moved toward the piston rod 220 in the horizontal direction, the release slider 250 drives the piston rod 220 through the mated first slope surface 220*a* and the second slope surface 250*a* against pushing force applied by the pushing spring 240 to move downward in the vertical direction Z so as to release the ball 230, such that the ball 230 moves from the work position to the release position under the action of gravity. In this case, the four restoring springs 120 may drive the two pairs of sliding blocks 110 to be moved toward each other in the first horizontal direction X and the second horizontal direction Y.

As shown in FIGS. 1, 2, and 3, in an exemplary embodiment of the present invention, when the release slider 250 is moved away from the piston rod 220 in the horizontal direction, the piston rod 220 is driven to move upward in the vertical direction Z by the pushing spring 240, such that the ball 230 may move upwardly from the release position to the work position and push the two pairs of sliding blocks 110 to move far away from each other in the first horizontal direction X and the second horizontal direction Y, respectively, against the four restoring springs 120.

As shown in FIGS. 1, 2, and 3, in an exemplary embodiment of the present invention, the positioning device further includes a pressing device 300, 310, 320 that press the electronic device 20 onto the circuit board 10.

As shown in FIGS. 1, 2, and 3, in an exemplary embodiment of the present invention, the electronic device 20 includes a main body and a plurality of soldering legs 21 extending horizontally outward from the main body. When the electronic device 20 is pressed on the circuit board 10, the main body of the electronic device 20 is in the opening 11 of the circuit board 10 while the soldering legs 21 are supported on the surface of the circuit board 10.

As shown in FIGS. 1, 2, and 3, in an exemplary embodiment of the present invention, the pressing device 300, 310, 320 mainly includes: a mounting bracket 300, a pressing block 310 and a pressing spring 320. The pressing block 310 is slidably mounted on the mounting bracket 300 and is capable of sliding in the vertical direction Z. The pressing spring 320 is on the mounting bracket 300 and is applies a vertical-downward press force to the pressing block 310 so as to press the electronic device 20 onto the circuit board 10.

According to an exemplary embodiment of the present invention, the circuit board 10 has a plurality of first positioning holes (not shown), the mounting bracket 300 has a plurality of second positioning holes (not shown) corresponding to the first positioning holes, and the support table 100 has a plurality of positioning pins (not shown). The positioning pins pass through the first positioning holes and the second positioning holes, respectively, so as to position the circuit board 10 and the mounting bracket 300 on the support table 100.

According to an exemplary embodiment of the present invention, the base 200 has a positioning shaft (not shown) and the support table 100 has a positioning hole (not shown). The positioning shaft passes through the positioning hole so as to position the support table 100 on the base 200.

According to an exemplary embodiment of the present invention, the electronic device includes a light emitting diode.

It should be appreciated by those skilled in this art that the above embodiments are all exemplary embodiments and many modifications may be made to the above embodiments by those skilled in this art, and various features described in different embodiments may be freely combined with each other without conflicting in configuration or principle.

Although the present disclosure has been described with reference to the attached drawings, the embodiments disclosed in the attached drawings are intended to describe the preferred embodiments of the present disclosure exemplarily, but should not be construed as a limitation to the present disclosure.

Although several embodiments of the general concept of the present disclosure have been shown and described, it would be appreciated by those skilled in the art that various changes or modifications may be made in these embodiments without departing from the principles and spirit of the disclosure, the scope of which is defined in the claims and their equivalents.

As used herein, term "comprising" or "having" should be understood as not excluding other elements or steps, and term "a" or "an" should be understood as not excluding plural elements or steps. In addition, any reference numeral in claims should not be understood as the limitation of the scope of the present disclosure.

What is claimed is:

1. A positioning device for positioning an electronic device in an opening of a circuit board, the positioning device comprising:
    a support table on which the circuit board is supported;
    two pairs of sliding blocks slidably mounted in the support table and movable in a first horizontal direction and a second horizontal direction perpendicular to the first horizontal direction, with a positioning plate extending vertically on the top of each sliding block;
    a base on which the support table is supported;
    a cylinder in the base;
    a ball in the cylinder;
    a piston rod slidably mounted in the cylinder that pushes the ball upward in a vertical direction with the ball driving the two pairs of sliding blocks to move away from each other in the first horizontal direction and the second horizontal direction, respectively, until the positioning plates of the two pairs of sliding blocks abut against four inner walls of the opening of the circuit board, respectively, to allow the electronic device to be received in a positioning slot defined by the positioning plates; and
    a release mechanism that drives a lower end of the piston rod to move downward in the vertical direction to allow the two pairs of sliding blocks to be moved toward each other in the first horizontal direction and the second horizontal direction, so that the positioning plates drive the electronic device received in the positioning slot to move toward a center of the opening of the circuit board.

2. The positioning device according to claim 1, wherein:
    (a) the bottom of each sliding block has a slope surface, and
    (b) the ball abuts the slope surfaces of the two pairs of sliding blocks at the same time.

3. The positioning device according to claim 1, wherein:
    (a) the positioning device further comprises four restoring springs in the support table and pushing against the sliding blocks, respectively, and
    (b) the ball drives against the elastic forces of the four restoring springs and the two pairs of sliding blocks to move the sliding blocks away from each other in the first horizontal direction and the second horizontal direction.

4. The positioning device according to claim 3, wherein the positioning device further includes a pushing spring in the cylinder and biasing the piston rod upward in the vertical direction against the elastic forces of the four restoring springs, so as to drive the piston rod to move upward in the vertical direction and the ball to a work position where the ball is brought into contact with the sliding blocks through the piston rod.

5. The positioning device according to claim 4, wherein a top of the piston rod has a flange and the pushing spring is sleeved on the piston rod and abuts against a bottom surface of the flange.

6. The positioning device according to claim 4, wherein:
    (a) the release mechanism has:
        (1) a first slope surface on the lower end of the piston rod which extends out of the cylinder, and (2) a release slider in the base and moveable in a horizontal direction perpendicular to the vertical direction and a second slope surface mated with the first slope surface, (b) in response to movement of the release slider toward the piston rod in the horizontal direction, the piston rod is driven to move downward, against the pushing spring, in the vertical direction through the mated first slope surface and the second slope surface, such that the two pairs of sliding blocks are allowed to be moved toward each other in the first horizontal direction and the second horizontal direction by the four restoring springs.

7. The positioning device according to claim 1, further including a pressing device adapted to press the electronic device onto the circuit board.

8. The positioning device according to claim 7, wherein the electronic device includes a main body and a plurality of soldering legs extending horizontally outward from the main body and when the electronic device is pressed on the circuit board, the main body of the electronic device is received in the opening of the circuit board while the soldering legs are supported on the surface of the circuit board.

9. The positioning device according to claim 8, wherein the pressing device includes:
    (a) a mounting bracket,
    (b) a pressing block mounted on the mounting bracket and slidable in the vertical direction, and
    (c) a pressing spring mounted on the mounting bracket and applying a vertical-downward press force to the pressing block, so as to press the electronic device onto the circuit board.

10. The positioning device according to claim 9, wherein:
    (a) the circuit board has a plurality of first positioning holes,
    (b) the mounting bracket has a plurality of second positioning holes associated with the first positioning holes, respectively, and
    (c) the support table has a plurality of positioning pins that pass through the first plurality of positioning holes and the second plurality of positioning holes, respectively, so as to position the circuit board and the mounting bracket on the support table.

11. The positioning device according to claim 1, wherein the support table has a positioning hole and the base has a positioning shaft that passes through the positioning hole so as to position the support table on the base.

12. The positioning device according to claim 1, wherein the electronic device comprises a light emitting diode.

13. A positioning device for positioning a first component in an opening of a second component, the positioning device comprising:
    a support table on which the circuit board is supported;
    two pairs of sliding blocks slidably mounted in the support table and movable in a first horizontal direction and a second horizontal direction perpendicular to the first horizontal direction, with a positioning plate extending vertically on the top of each sliding block;
    a base on which the support table is supported;
    a cylinder in the base;
    a ball in the cylinder;
    a piston rod slidably mounted in the cylinder that pushes the ball upward in a vertical direction with the ball driving the two pairs of sliding blocks to move away from each other in the first horizontal direction and the second horizontal direction, respectively, until the positioning plates of the two pairs of sliding blocks abut against four inner walls of the opening of the circuit board, respectively, to allow the electronic device to be received in a positioning slot defined by the positioning plates; and
    a release mechanism that drives a lower end of the piston rod to move downward in the vertical direction to allow the two pairs of sliding blocks to be moved toward each other in the first horizontal direction and the second horizontal direction, so that the positioning plates drive the electronic device received in the positioning slot to move toward a center of the opening of the circuit board.

14. A positioning device for positioning an electronic device in an opening of a circuit board, the positioning device comprising:
    a support table on which the circuit board is supported;
    a pair of sliding blocks slidably mounted beneath a surface of the support table and movable in a first horizontal direction and a second horizontal direction perpendicular to the first horizontal direction, with a positioning plate extending vertically on the top of each sliding block;
    a piston rod slidably mounted below the pair of sliding blocks and adapted to drive each of the pair of sliding blocks to move away from each other in the first horizontal direction and the second horizontal direction, respectively, in a direction toward inner walls of the opening; and
    a release mechanism engaging with a lower end of the piston rod to drive the piston rod downward in the vertical direction to allow the two pairs of sliding blocks to be moved toward each other in the first horizontal direction and the second horizontal direction.

15. The positioning device according to claim 14, further comprising a ball arranged at least partially below the pair of sliding blocks, the piston rod slidably mounted below the ball and adapted to push the ball upward in the vertical direction with the ball driving each of the pair of sliding blocks to move away from each other in the first horizontal direction and the second horizontal direction.

16. The positioning device according to claim 14, wherein the release mechanism includes:
    a release slider movable transverse to the vertical direction; and
    at least one of a first slope surface on the lower end of the piston rod or a second slope surface formed on the release slider.

17. The positioning device according to claim 16, wherein the release mechanism includes the first slope surface on the lower end of the piston rod, and the second slope surface on the release slider, the first and second slope surfaces slidably mated together.

18. The positioning device according to claim 17, wherein in response to movement of the release slider toward the piston rod, the piston rod is driven to move downward in the vertical direction through the mated first slope surface and the second slope surface, such that the pair of sliding blocks are free to be moved toward each other in the first horizontal direction and the second horizontal direction.

19. The positioning device according to claim 14, wherein the positioning device further comprises a pair restoring springs pushing against the pair of sliding blocks, respectively, the piston rod driving against the elastic forces of the restoring springs and the pair of sliding blocks to move the sliding blocks away from each other in the first horizontal direction and the second horizontal direction.

20. The positioning device according to claim 14, further comprising:
- a pushing spring biasing the piston rod upward in the vertical direction; and
- a base arranged below the support table and housing at least a portion of the piston rod and the release mechanism.

* * * * *